(12) United States Patent
Kim

(10) Patent No.: US 6,927,131 B2
(45) Date of Patent: Aug. 9, 2005

(54) METHODS OF FORMING A NONVOLATILE MEMORY DEVICE HAVING A LOCAL SONOS STRUCTURE THAT USE SPACERS TO ADJUST THE OVERLAP BETWEEN A GATE ELECTRODE AND A CHARGE TRAPPING LAYER

(75) Inventor: Seong-gyun Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 10/625,713

(22) Filed: Jul. 23, 2003

(65) Prior Publication Data

US 2004/0127062 A1 Jul. 1, 2004

(30) Foreign Application Priority Data

Aug. 19, 2002 (KR) ................................ 10-2002-0048967

(51) Int. Cl.[7] ............................................. H01L 21/336
(52) U.S. Cl. ........................................ 438/261; 438/287
(58) Field of Search ................................. 438/216, 259, 438/261, 264, 266, 287, 288, 591, 954

(56) References Cited

U.S. PATENT DOCUMENTS 6,835,621 B2 * 12/2004 Yoo et al. .................... 438/261
6,849,514 B2 *  2/2005 Han ............................. 438/287
2004/0197995 A1 * 10/2004 Lee et al. .................... 438/257

* cited by examiner

Primary Examiner—Jack Chen
(74) Attorney, Agent, or Firm—Myers Bigel Sibley & Sajovec

(57) ABSTRACT

A nonvolatile memory device is formed by forming a first oxide layer on a substrate. A nitride layer is formed on the first oxide layer. A second oxide layer is formed on the nitride layer. The second oxide layer is patterned so as to expose the nitride layer. A first polysilicon layer is formed on the second oxide layer and the exposed portion of the nitride layer. The first polysilicon layer and the nitride layer are etched so as to expose the second oxide layer and the first oxide layer and to form polysilicon spacers on the nitride layer. The polysilicon spacers are etched so as to expose portions of the nitride layer. The exposed portions of the nitride layer may function as charge trapping layers. The exposed portion of the first oxide layer is etched to expose a portion of the substrate. A third oxide layer is formed on the exposed portion of the substrate, the exposed portions of the nitride layer, and the second oxide layer. A second polysilicon layer is formed on the third oxide layer. The second polysilicon layer is planarized so as to expose the second oxide layer. The second polysilicon layer may function as a gate electrode that overlaps portions of the charge trapping layers. The third oxide layer may function as a gate-insulating layer.

15 Claims, 6 Drawing Sheets

METHODS OF FORMING A NONVOLATILE MEMORY DEVICE HAVING A LOCAL SONOS STRUCTURE THAT USE SPACERS TO ADJUST THE OVERLAP BETWEEN A GATE ELECTRODE AND A CHARGE TRAPPING LAYER

RELATED APPLICATION

This application claims the benefit of and priority to Korean Patent Application No. 2002-48967, filed Aug. 19, 2002, the disclosure of which is hereby incorporated herein by reference.

FIELD OF THE INVENTION

The present invention relates to a method for fabricating nonvolatile memory devices, and more particularly, to method of fabricating nonvolatile memory devices having a local SONOS (Silicon-Oxide-Nitride-Oxide-Silicon) structure.

BACKGROUND OF THE INVENTION

In general, semiconductor memory devices used for storing data are divided into two types: volatile and nonvolatile. A volatile memory device loses stored data when the power supply is interrupted, while a nonvolatile memory device maintains the stored data when the power supply is interrupted. Therefore, in applications where the power supply is not always continuous, occasionally interrupted, requires the use of low power on occasion, such as in a mobile communication system, a memory card for storing music and/or image data, and/or other applications, nonvolatile memory devices are generally more widely used.

Typically, a nonvolatile device is formed using a stacked gate in which a gate insulating layer, a floating gate electrode, an inter-gate insulating layer, and a control gate electrode are sequentially stacked. In some implementations, a nonvolatile memory device may be formed by including a silicon layer in which a channel area is formed, an oxide layer in which a tunneling layer is formed, a nitride layer used as a charge trapping layer, an oxide layer used as a blocking layer, and/or a silicon layer used as a control gate electrode. Hereinafter, the above-mentioned layers will be terms a SONOS (Silicon-Oxide-Nitride-Oxide-Silicon) structure. Some implementations configure the nitride layer, which functions as the charge trapping layer, so that it overlaps with only a portion of the silicon layer, which is used as the control gate electrode. It is generally known that operations of a nonvolatile memory device having a local SONOS structure may be improved based on the adjustment of the length of the overlapping portion of the charge trapping layer and the gate electrode.

FIGS. 1 through 4 are sectional views of a conventional method for fabricating a nonvolatile memory device having a local SONOS structure. As shown in FIG. 1, an ONO layer 110 is formed on a silicon substrate 100 and a first photoresist layer pattern 121 is formed on the ONO layer 110. The ONO layer 110 has a structure in which a first oxide layer 111, a nitride layer 113 and a second oxide layer 115 are sequentially stacked. The first photoresist layer pattern 121 has an opening that exposes a part of a surface of the second oxide layer 115. Etching is performed by using the first photoresist layer pattern 121 as an etching mask to sequentially remove exposed parts of the second oxide layer 115, the nitride layer 113, and the first oxide layer 111. Then, as shown in FIG. 2, a part of a surface 101 of the silicon substrate 100 is exposed and ONO layer patterns 110' are formed on both sides of the exposed surface 101, respectively. After etching is complete, the first photoresist layer pattern 121 is removed.

As shown in FIG. 3, a third oxide layer 130 is formed as a gate insulating layer on the exposed surface 101 of a silicon substrate 100 as shown in FIG. 2 by performing an oxidation process. A polysilicon layer 140 and a second photoresist layer pattern 122 are sequentially formed on the ONO layer pattern 110' and the third oxide layer 130. Etching is performed using the second photoresist layer pattern 122 as an etching mask to remove exposed parts of the polysilicon layer 140 and the ONO layer pattern 110'. After etching is complete, the second photoresist layer pattern 122 is removed and then a polysilicon layer pattern 142, which is to be used as the control gate electrode, is formed as shown in FIG. 4. In addition, on both sides of the polysilicon layer pattern 142, a tunneling layer 112, a charge trapping layer 114, and a blocking layer 116 are formed so as to be arranged at the sides of the polysilicon layer pattern 142 and to be sequentially stacked on the silicon substrate 100. "A" denotes the length of an overlapping portion of the charge-trapping layer 114 and the polysilicon layer pattern 142. A source region 162 and a drain region 164 are formed respectively in a predetermined area of an upper portion of the silicon substrate 100 by performing, for example, an ion implantation using the polysilicon layer pattern 142 and a predetermined mask layer pattern (not shown) as an ion implantation mask.

As described above, according to a conventional method of fabricating a nonvolatile memory device, the length of the overlapping portions of the charge trapping layer 114 and the polysilicon layer pattern 142, "A," is determined by the first photoresist layer pattern 121 as shown in FIG. 1 and the second photoresist layer pattern 122 as shown in FIG. 3. Accordingly, as the degree of integration of a device increases, the susceptibility to misalignment in photolithographic processing increases. Thus, the length "A" may become irregular depending on the specific positioning. Irregularity in the length of "A" may result in irregular characteristics of a memory cell, which may ultimately degrade the reliability of a memory device.

SUMMARY OF THE INVENTION

According to some embodiments of the present invention, a nonvolatile memory device is formed by forming a first oxide layer on a substrate. A nitride layer is formed on the first oxide layer. A second oxide layer is formed on the nitride layer. The second oxide layer is patterned so as to expose the nitride layer. A first polysilicon layer is formed on the second oxide layer and the exposed portion of the nitride layer. The first polysilicon layer and the nitride layer are etched so as to expose the second oxide layer and the first oxide layer and to form polysilicon spacers on the nitride layer. The polysilicon spacers are etched so as to expose portions of the nitride layer. The exposed portions of the nitride layer may function as charge trapping layers. The exposed portion of the first oxide layer is etched to expose a portion of the substrate. A third oxide layer is formed on the exposed portion of the substrate, the exposed portions of the nitride layer, and the second oxide layer. A second polysilicon layer is formed on the third oxide layer. The second polysilicon layer is planarized so as to expose the second oxide layer. The second polysilicon layer may function as a gate electrode that overlaps portions of the charge trapping layers. The third oxide layer may function as a gate-insulating layer.

In other embodiments, the nonvolatile memory device is further formed by etching the exposed portion of the second oxide layer, the nitride layer, and the first oxide layer using the gate electrode as a mask so as to expose the substrate. A source region and a drain region may be formed in exposed portions of the substrate on adjacent sides of the gate electrode.

In still other embodiments, the source region and the drain region may be formed using ion implantation.

In still other embodiments, a nonvolatile memory device is further formed by etching a middle portion of the gate electrode and the gate insulating layer so as to expose the substrate and form first and second gate electrodes and first and second gate insulating layers. An impurity region is formed in the exposed portion of the substrate between the first and second gate electrodes and the first and second gate insulating layers. The impurity region may be formed using ion implantation.

In further embodiments, the first oxide layer may be formed using thermal oxidation, the nitride layer and the second oxide layer may be formed using low-pressure chemical vapor deposition, and the third oxide layer and second polysilicon layer may be formed using chemical vapor deposition.

In still further embodiments, the first polysilicon layer may be etched using an isotropic etch back process and the exposed portion of the first oxide layer may be etched using a wet etching process.

In still further embodiments, the second polysilicon layer may be planarized using chemical mechanical polishing.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
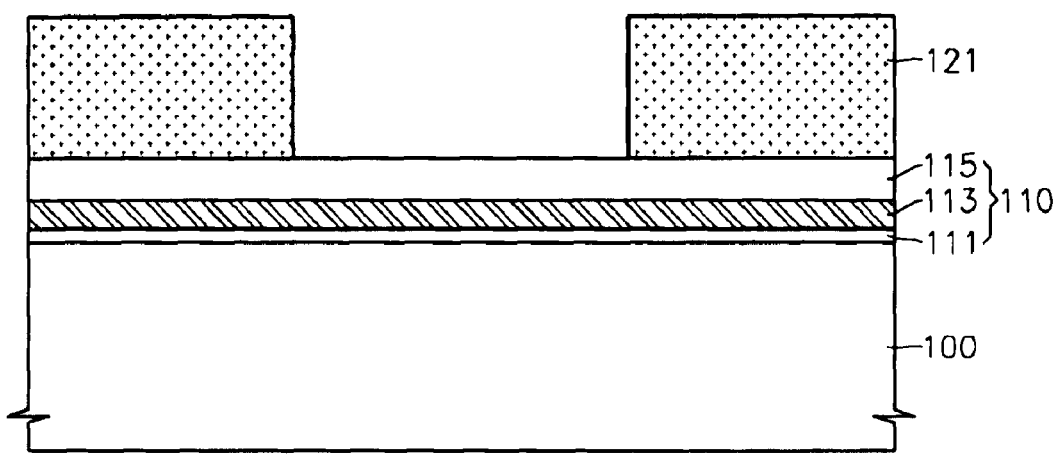
FIGS. 1 through 4 are sectional views that illustrate a conventional method for fabricating a nonvolatile memory device having a local SONOS structure.
Figure 2:
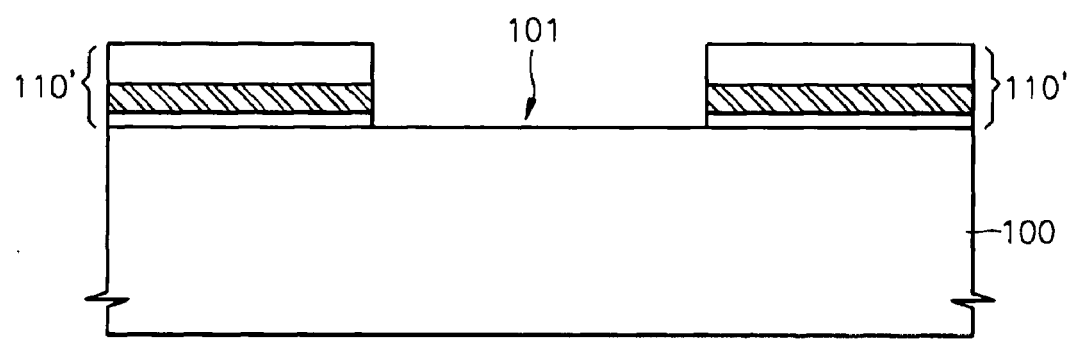
Figure 3:
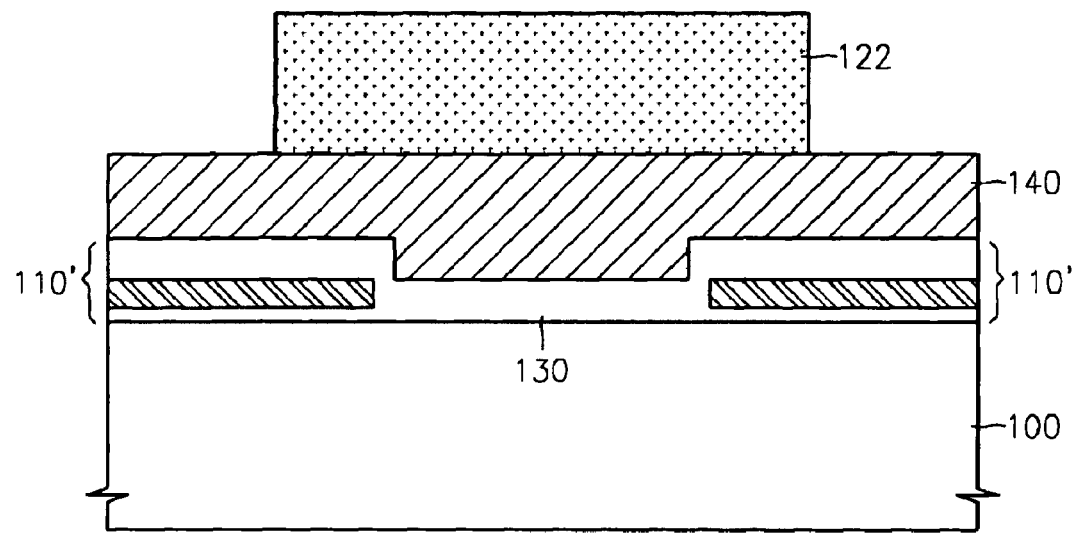
Figure 4:
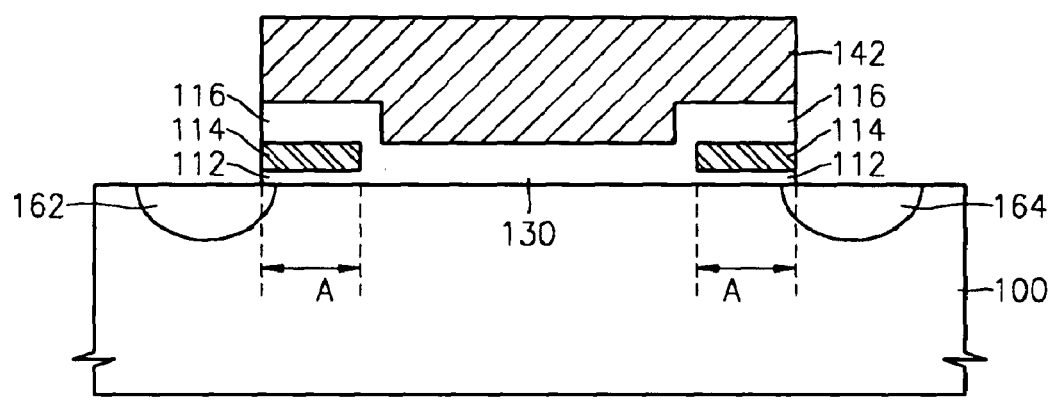

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 5:
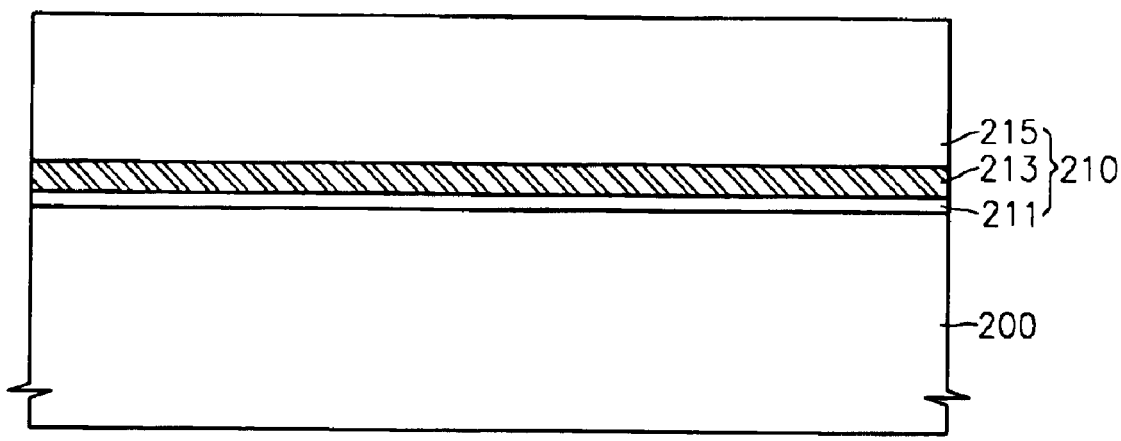
FIGS. 5 through 11 are sectional views that illustrate methods of forming a nonvolatile memory device in accordance with some embodiments of the present invention.

FIGS. 5 through 11 are sectional views that illustrate methods of fabricating a nonvolatile memory device having a local SONOS structure according to some embodiments of the present invention. Referring now to FIG. 5, an ONO layer 210 is formed on a silicon substrate 200. The ONO layer 210 is formed by sequentially stacking a first oxide layer 211, a nitride layer 213, and a second oxide layer 215. In some embodiments, the first oxide layer 211 can be formed by performing a thermal oxidation process on the silicon substrate 200. The thermal oxidation may be performed in an atmosphere containing nitrogen, such as $N_2O$ gas or NO gas. The nitride layer 213 and the second oxide layer 215 may be formed using LP-CVD (Low-Pressure Chemical Vapor Deposition). The nitride layer 213 may also be formed by a nitridation process of the first oxide layer 211, in accordance with other embodiments of the present invention. The second oxide layer 215 may be formed to be substantially thicker than conventional oxide layers.

Figure 6:
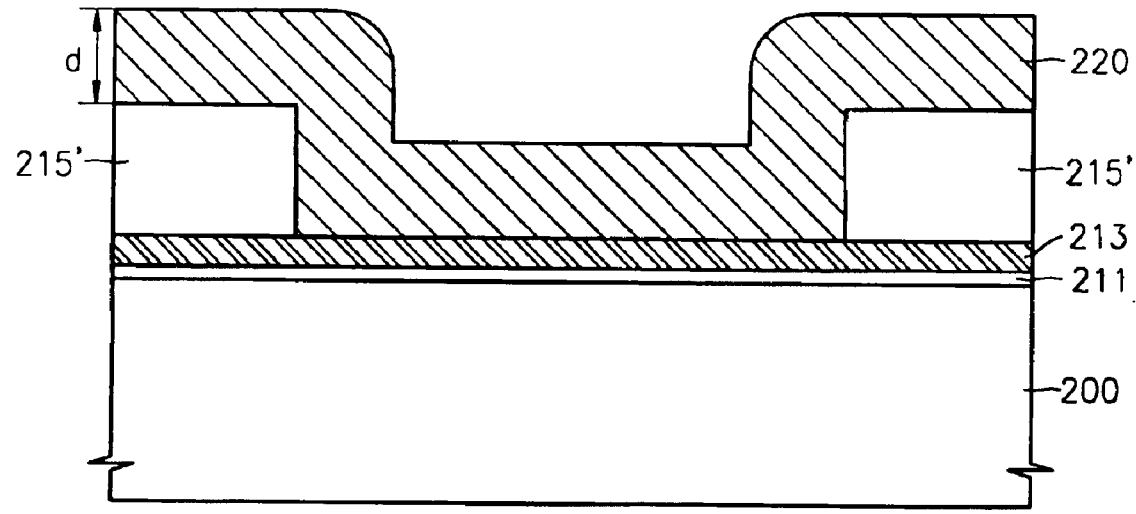

Referring now to FIG. 6, a second oxide layer pattern 215' is formed by patterning the second oxide layer 215. A middle portion of the surface of the nitride layer 213 is exposed by the second oxide layer pattern 215'. To form the second oxide layer pattern 215', a mask layer pattern (not shown) is initially formed on the second oxide layer 215. Then, an etching process is performed using the mask layer pattern as an etching mask to remove the exposed second oxide layer 215 until a portion of the surface of the nitride layer 213 is exposed. After forming the second oxide layer pattern 215', a first polysilicon layer 220 is formed to cover the second oxide layer pattern 215' and the exposed surface of the nitride layer 213 substantially in their entirety. A thickness "d" of the first polysilicon layer 220 is a factor that determines the length of an overlapping portion of a subsequent charge trapping layer and a control gate electrode. Accordingly, the thickness "d" of the first polysilicon layer 220 is adjusted accordingly to obtain a desired length of the overlapping part of the charge trapping layer and the control gate electrode.

Figure 7:
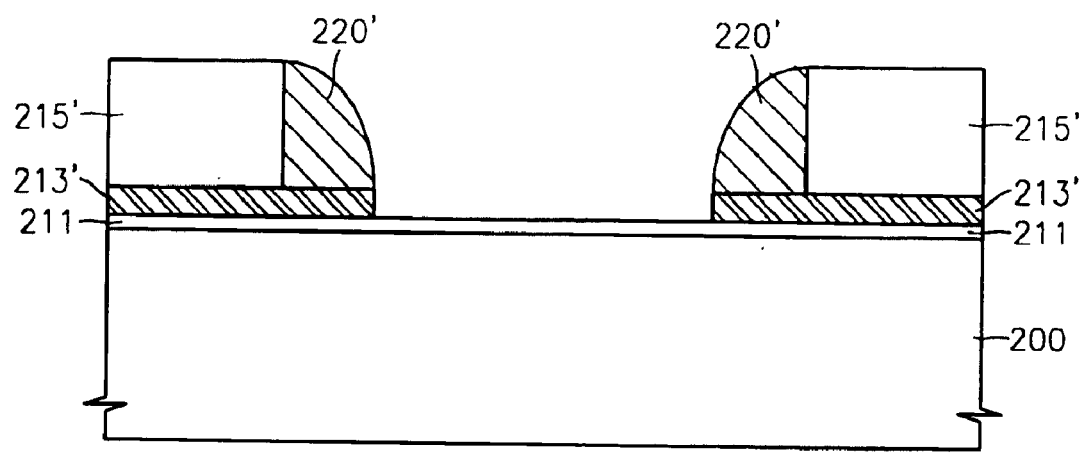

Referring now to FIG. 7, isotropic etching of the first polysilicon layer 220 is performed until the upper surface of the second oxide layer pattern layer 215' is exposed. A polysilicon layer spacer 220' is then formed on sidewalls of the second oxide pattern 215' and a portion of the surface of the nitride layer 213 as shown in FIG. 6. An etch back process may be used for the isotropic etching process in accordance with some embodiments of the present invention. After the polysilicon layer spacer 220' is formed, a portion of the surface of the nitride layer 213 as well as a surface of an upper portion of the second oxide layer pattern 215' is exposed. Accordingly, a nitride layer pattern 213' is formed after an exposed surface of the nitride layer 213 is removed. The second oxide layer pattern 215' and the first polysilicon layer spacer 220' may be used as a mask layer when removing the exposed surface of the nitride layer 213. A surface of the upper portion of the nitride layer pattern 213' is covered by the second oxide layer pattern 215' and the first polysilicon layer spacer 220'. Because a portion of the surface of the first oxide layer 211 is exposed between the polysilicon layer spacers 220', an etching process is performed to remove the first polysilicon layer spacer 220'.

Figure 8:
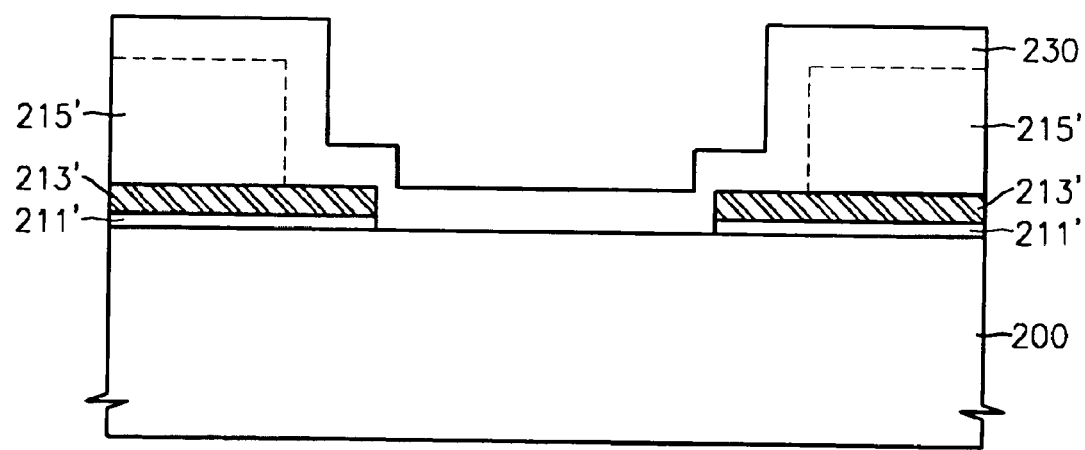

Referring now to FIG. 8, an exposed portion of the first oxide layer 211 is removed by performing an etching process using the nitride layer pattern 213' as an etching mask. A first oxide layer pattern 211' is formed to expose a portion of the surface of the silicon substrate 200 in which a gate-insulating layer is to be formed. According to some embodiments of the present invention, a wet etching method may be used when exposing part of the surface of the silicon substrate 200 because a dry etching method using a plasma may cause damage to the silicon substrate 200. A third oxide layer 230 is formed to cover the exposed portion of the silicon substrate 200. In this process, the third oxide layer 230 covers the exposed surface of the nitride layer pattern 213' as well as the surface of the upper portion of the second oxide layer pattern 215'. The foregoing process for forming an oxide layer may be performed using CVD according to some embodiments of the present invention. After forming the third oxide layer 230 using, for example, CVD, the third oxide layer 230 may be hardened by conventional annealing. To form the third oxide layer 230 thicker than a conventionally formed layer, thermal oxidation may be performed instead of annealing. In this case, the third oxide layer 230 may be thicker than a conventionally formed layer while being hardened.

Figure 9:
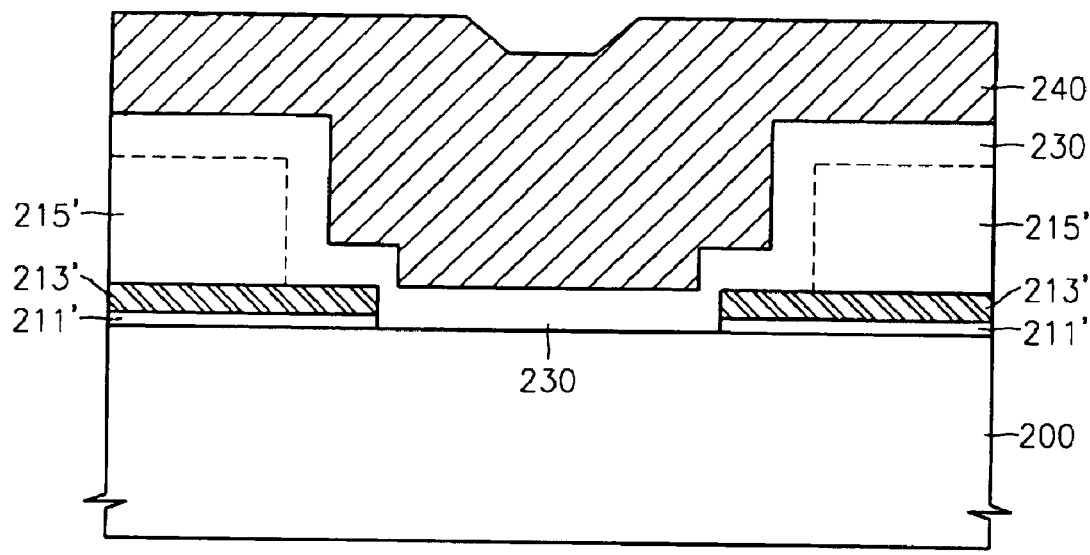

Referring now to FIG. 9, a second polysilicon layer 240 is formed on the third oxide layer 230. The second polysilicon layer 240 may be formed using CVD. In some embodiments of the present invention, the second polysilicon layer 240 is doped with an n-type impurity, for example, phosphorus, by mixing phosphine gas of about 10% source gas when the second polysilicon layer 240 is formed using CVD. This may allow the second polysilicon layer 240 to have higher conductivity than it would otherwise have without being doped.

Figure 10:
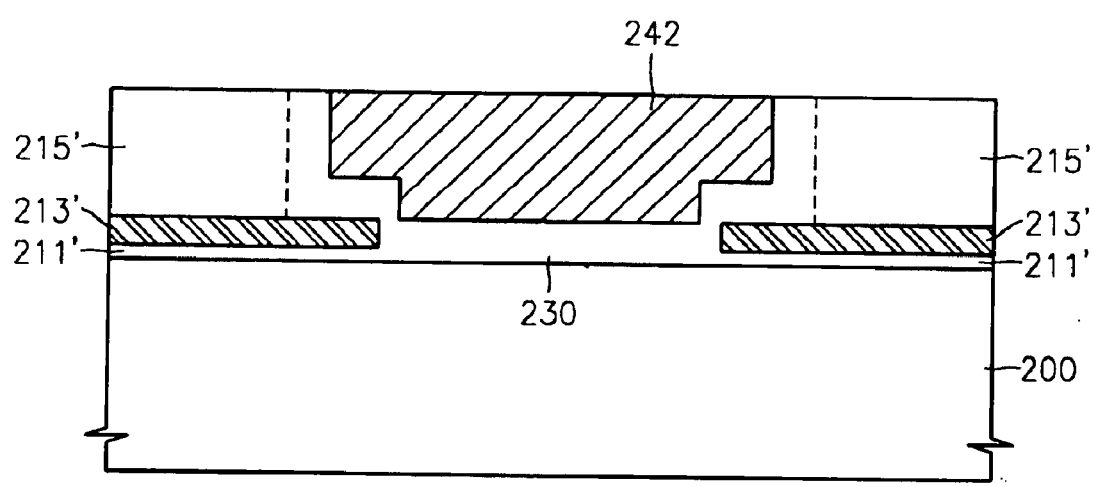

Referring now to FIG. 10, a portion of the second polysilicon layer 240 is removed by performing a planarization process so as to expose the second oxide layer pattern 215'. The planarization process may be performed by CMP (Chemical Mechanical Polishing). The planarization process may be performed until the second oxide layer pattern 215' is exposed. In some embodiments of the present invention, the planarization process may be performed until the third oxide layer 230 is exposed. After the planarization process is complete, a control gate electrode 242 comprising the second polysilicon layer pattern is formed.

Figure 11:
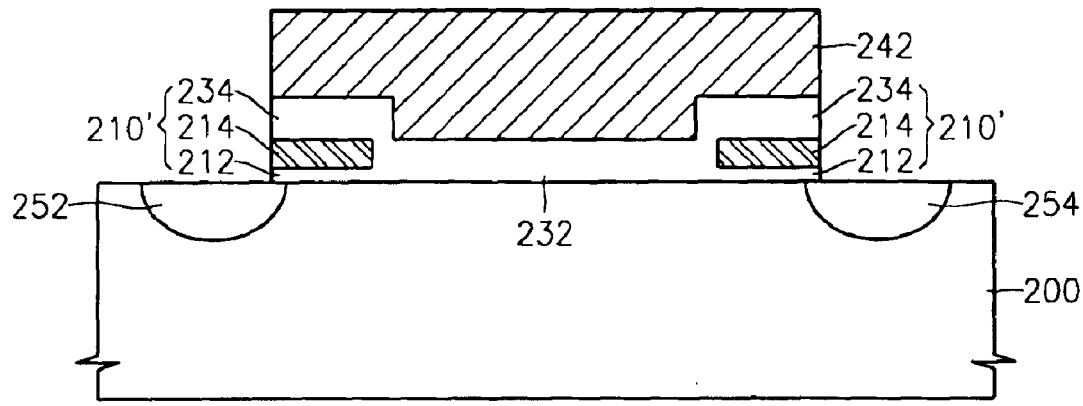

Referring now to FIG. 11, an etching process is performed using the control gate electrode 242 as an etching mask to remove parts of the second oxide layer pattern 215' and the third oxide layer 230, which are exposed by the control gate electrode 242. Then, part of the surface of the nitride layer pattern 213' is exposed and an etching process is continued so as to remove the exposed part of the nitride layer pattern 213'. When the nitride layer pattern 213' is removed, part of the surface of the first oxide layer pattern 211' is exposed. The etching process is continued to remove an exposed portion of the first oxide layer pattern 211' so as to expose a part of the silicon substrate 200. After the above etching process is complete, a vertical structure 210' is formed on the sides of the control gate electrode 242 in which a tunneling layer 212 formed from the first oxide layer pattern, a charge trapping layer 214 formed from the nitride layer pattern, and a blocking layer 234 formed from the third oxide layer are sequentially stacked. A gate insulating layer 232 formed from the third oxide layer is disposed between the silicon substrate 200 and the control gate electrode 242.

To reduce a current resistance of a gate line, a metal silicide layer may be formed on an upper portion of the control gate electrode 242 in accordance with some embodiments of the present invention. A tungsten silicide (WSi) layer, a cobalt silicide (CoSi) layer, and/or a titanium silicide (TiSi) layer may be used as the metal silicide layer. After the foregoing etching process is complete, an ion implantation process may be performed using the control gate electrode 242 and a predetermined mask layer pattern as an ion implantation mask to form a predetermined source region 252 and a drain region 254 in a specific area of the upper portion of the silicon substrate 200.

Figure 12:
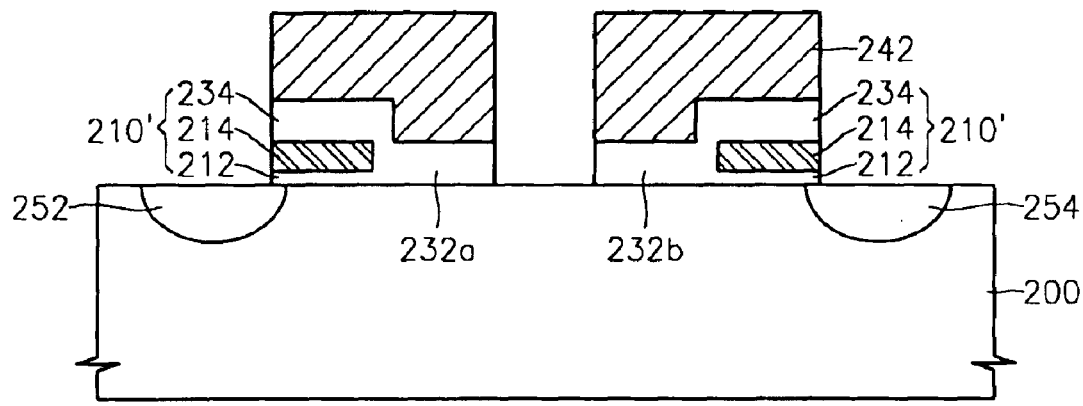
FIGS. 12 and 13 are sectional views that illustrate methods of forming a nonvolatile memory device in accordance with additional embodiments of the present invention.
Figure 13:
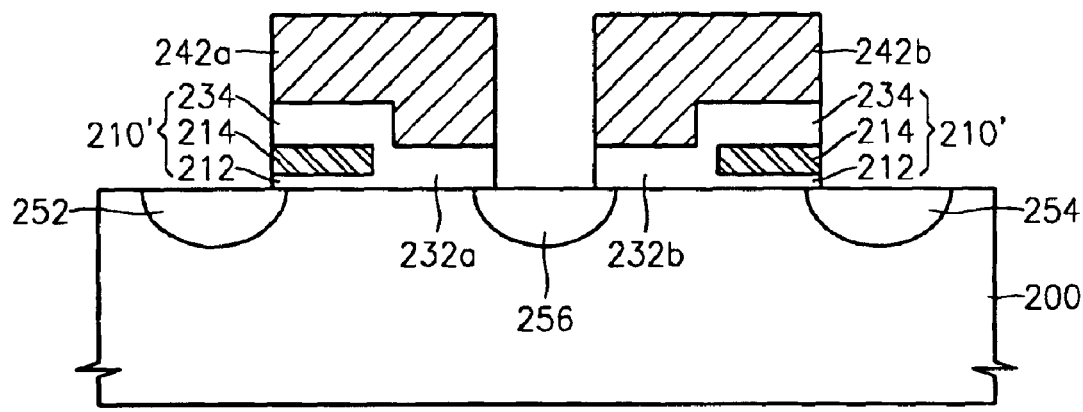

FIGS. 12 and 13 are sectional views of methods of fabricating a nonvolatile memory device having a local SONOS structure according to additional embodiments of the present invention. More specifically, the figures illustrate methods of fabricating a nonvolatile memory device having a local SONOS structure that is capable of performing a one-bit operation.

Referring now to FIG. 12, methods of fabricating a nonvolatile memory device according to additional embodiments of the present invention comprise the same process as those described above with reference to FIGS. 5 to 10. In addition, the methods also comprise the same processes that precede the formation of the source region 252 and the drain region 254 as shown in FIG. 11. A mask layer pattern is formed on the control gate electrode 242 shown in FIG. 11. The mask layer pattern has an opening that exposes the middle portion of the control gate electrode 242. An etching process is performed using the mask layer pattern as an etching mask to remove an exposed portion of the control gate electrode 242 so as to expose part of the surface of the gate insulating layer 232. The etching process continues so as to remove the exposed portion of the gate-insulating layer 232 and to expose a part of the surface of the silicon substrate 200. Subsequently the mask layer pattern is removed. As a result, a first control gate electrode 242a and a second control gate electrode 242b are formed to be separate at a specific distance from one another as shown in FIG. 13. Further, a first gate insulating layer 232a of the lower portion of the first control gate electrode 242a and a second gate insulating layer 242b of the lower portion of the second control gate electrode 232b are also formed as shown in FIG. 13. In this process, the silicon substrate 200 between the first control gate electrode 242a and the second control gate electrode 242b is exposed.

As shown in FIG. 13, an ion implantation process may be performed using the first control gate electrode 242a, the second control gate electrode 242b, and a predetermined mask layer pattern as an ion implantation mask to form a source region 252, a drain region 254, and an impurity region 256 in specific areas of an upper portion of the silicon substrate 200. The source region 252 is formed in the silicon substrate 200 adjacent to the charge trapping layer 214 of the lower portion of the first control gate electrode 242a. The drain region 254 is formed in the silicon substrate 200 adjacent to the charge trapping layer 214 of the lower portion of the second control gate electrode 242b. The impurity area 256 is formed in the silicon substrate 200 between the first control gate electrode 242a and the second control gate electrode 242b.

As described above, methods of fabricating a nonvolatile memory device having a local SONOS structure according to some embodiments of the present invention may provide more uniformity in a length of a charge trapping layer that overlaps with a control gate electrode. As a result, uniformity in the formation of a device may be improved. Moreover, the methods may be beneficial in that a desired overlap length of the control gate electrode and the charge trapping layer may be obtained by adjusting the thickness of the polysilicon layer.

In concluding the detailed description, it should be noted that many variations and modifications can be made to the preferred embodiments without substantially departing from the principles of the present invention. All such variations That which is claimed:

1. A method of forming a nonvolatile memory device, comprising:

forming a first oxide layer on a substrate;

forming a nitride layer on the first oxide layer;

forming a second oxide layer on the nitride layer;

patterning the second oxide layer so as to expose the nitride layer;

forming a first polysilicon layer on the second oxide layer and the exposed portion of the nitride layer;

etching the first polysilicon layer and the nitride layer so as to expose the second oxide layer and the first oxide layer and to form polysilicon spacers on the nitride layer;

etching the polysilicon spacers so as to expose portions of the nitride layer, the exposed portions of the nitride layer comprising charge trapping layers;

etching the exposed portion of the first oxide layer to expose a portion of the substrate;

forming a third oxide layer on the exposed portion of the substrate, the exposed portions of the nitride layer, and the second oxide layer;

forming a second polysilicon layer on the third oxide layer; and planarizing the second polysilicon layer so as to expose the second oxide layer, the second polysilicon layer comprising a gate electrode that overlaps portions of the charge trapping layers, the third oxide layer comprising a gate insulating layer.

2. The method of claim 1, further comprising:

etching the exposed portion of the second oxide layer, the nitride layer, and the first oxide layer using the gate electrode as a mask so as to expose the substrate.

3. The method of claim 2, further comprising:

forming a source region and a drain region in exposed portions of the substrate on adjacent sides of the gate electrode.

4. The method of claim 3, wherein forming the source region and the drain region comprises:

forming the source region and the drain region in exposed portions of the substrate on adjacent sides of the gate electrode using ion implantation.

5. The method of claim 1, wherein forming the first oxide layer on the substrate comprises:

forming the first oxide layer on the substrate using thermal oxidation.

6. The method of claim 1, wherein forming the nitride layer on the first oxide layer comprises:

forming the nitride layer using low-pressure chemical vapor deposition on the first oxide layer.

7. The method of claim 1, wherein forming the second oxide layer on the nitride layer comprises:

forming the second oxide layer using low-pressure chemical vapor deposition on the nitride layer.

8. The method of claim 1, wherein etching the first polysilicon layer comprises:

etching the first polysilicon layer using an isotropic etch back process.

9. The method of claim 1, wherein etching the exposed portion of the first oxide layer comprises:

etching the exposed portion of the first oxide layer using a wet etching process.

10. The method of claim 1, wherein forming the third oxide layer on the exposed portion of the substrate, the exposed portions of the nitride layer, and the second oxide layer comprises:

forming the third oxide layer on the exposed portion of the substrate, the exposed portions of the nitride layer, and the second oxide layer using chemical vapor deposition.

11. The method of claim 1, wherein forming the second polysilicon layer on the third oxide layer comprises:

forming the second polysilicon layer on the third oxide layer using chemical vapor deposition.

12. The method of claim 1, wherein planarizing the second polysilicon layer comprises:

planarizing the second polysilicon layer using chemical mechanical polishing.

13. A method of forming a non-volatile memory device, comprising:

forming a first oxide layer on a substrate;

forming a nitride layer on the first oxide layer;

forming a second oxide layer on the nitride layer wherein a portion of the nitride layer is exposed between portions of the second oxide layer;

forming spacers on exposed portions of the nitride layer adjacent the second oxide layer so that a portion of the nitride layer remains exposed between the spacers;

removing portions of the nitride layer and the first oxide layer exposed by the spacers to thereby expose portions of the substrate between the spacers;

removing the spacers;

forming a third oxide layer on the exposed portion of the substrate, on exposed portions of the nitride layer adjacent the second oxide layer, and on the second oxide layer;

forming a conductive electrode on the third oxide layer between the portions of the second oxide layer.

14. A method according to claim 13 wherein forming the conductive electrode comprises:

forming a conductive layer on the third oxide layer between portions of the second oxide layer and opposite the second oxide layer; and planarizing the conductive layer to expose oxide of the second oxide layer and/or third oxide layer.

15. A method according to claim 14, further comprising:

after planarizing the conductive electrode, removing remaining portions of the third oxide layer, the second oxide layer, the nitride layer, and the first oxide layer exposed by the planarized conductive electrode.

* * * * *